United States Patent [19]
Efland et al.

[11] Patent Number: 5,905,308
[45] Date of Patent: May 18, 1999

[54] BOND PAD FOR INTEGRATED CIRCUIT

[75] Inventors: Taylor R. Efland, Richardson; Charles E. Williams, Dallas; Buford H. Carter, Richardson, all of Tex.

[73] Assignee: Texas Instruments Incorporated, Dallas, Tex.

[21] Appl. No.: 08/964,517

[22] Filed: Nov. 5, 1997

[51] Int. Cl.[6] .............................. A01L 23/48; A01L 23/52

[52] U.S. Cl. .......................... 257/786; 257/784; 257/750; 257/767

[58] Field of Search .................................. 257/784, 786, 257/750, 767

[56] References Cited

U.S. PATENT DOCUMENTS 3,409,807  11/1968  Gerstner .................................. 257/786
4,151,545   4/1979  Schnepf et al. ......................... 257/784

*Primary Examiner*—Teresa M. Arroyo
*Attorney, Agent, or Firm*—Jacqueline J. Garner; W. James Brady, III; Richard L. Donaldson

[57] ABSTRACT

A bond pad (18, 58) may comprise a base (20, 60) of bondable material. The base (20, 60) may have a periphery (26, 66). A segment of an interconnect (24, 64) may contact an extended section (28, 68) of the periphery (26, 66) to electrically couple the interconnect (24, 64) to the bond pad (18, 58). The interconnect (24, 64) may comprise a material less resistive than the bondable material.

18 Claims, 3 Drawing Sheets

BOND PAD FOR INTEGRATED CIRCUIT

TECHNICAL FIELD OF THE INVENTION

This invention relates generally to integrated circuits, and more particularly to an improved bond pad for packaging integrated circuits and method.

BACKGROUND OF THE INVENTION

Integrated circuit chips often include a number of bond pads to establish electrical contacts between the chips and external devices. The devices may be lead frames, printed circuit boards, interposers and the like.

In accordance with conventional bond pad layout rules, bond pads are indirectly connected to interconnects of the integrated circuit. Typically, bond pads are separated from interconnects by a layer of insulation. A via in the layer of insulation may provide an electrical contact point between the interconnect and the bond pad.

Bond pads generally have a relatively high resistance. This resistance has become increasingly problematic as the performance standards of integrated circuits has increased.

SUMMARY OF THE INVENTION

Accordingly, a need has arisen in the art for an improved bond pad. The present invention provides a bond pad and method that reduces the resistance of the bond between an integrated circuit and a device.

In accordance with the present invention, a bond pad may comprise a base of bondable material. The base may have a periphery. A segment of an interconnect may contact an extended section of the periphery to electrically couple the interconnect to the bond pad. The interconnect may comprise a material less resistive than the bondable material.

More specifically, in accordance with one embodiment of the present invention, a bond may attach a connector to the base of the bond pad. The connector may be operable to electrically couple the bond pad to a device, such as a lead frame. In this embodiment, the bond may contact the segment.

Important technical advantages of the present invention may include providing an improved bond pad for an integrated circuit. In particular, a segment of the interconnect may contact an extended section of the periphery of the base of the bond pad to electrically couple the interconnect to the bond pad and connector. The extended contact between the base and the interconnect provides a larger path for current to flow from the interconnect to the base. Accordingly, current is redistributed around the base in an electrically parallel manner and resistance of the bond pad is proportionally reduced. The reduction in resistance enhances the performance of integrated circuits, particularly those including very small ohmic transistors.

Another technical advantage of the present invention includes providing a dual surface bond at the bond pad. In particular, the bond may contact both the base and the interconnect segment of the bond pad. Accordingly, an electrical path is created directly between the interconnect and the bond in addition to the path through the base of the bond pad.

Still another technical advantage of the present invention includes providing a self-aligning bond pad. In particular, a bond may be self-aligned by the segment of the interconnect contacting the periphery of the bond pad base.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings wherein like reference numerals represent like parts, in which.

DETAILED DESCRIPTION OF THE INVENTION

The preferred embodiments of the present invention and its advantages are best understood by referring now in more detail to FIGS. 1–6 of the drawings, in which like numerals refer to like parts throughout the several views. As described in detail below, the present invention provides an improved bond pad for an integrated circuit. The bond pad reduces resistance of the bond between the integrated circuit and a lead frame or other type of device. The reduction in resistance enhances the performance of integrated circuits, particularly those including very small ohmic transistors.

Figure 1:
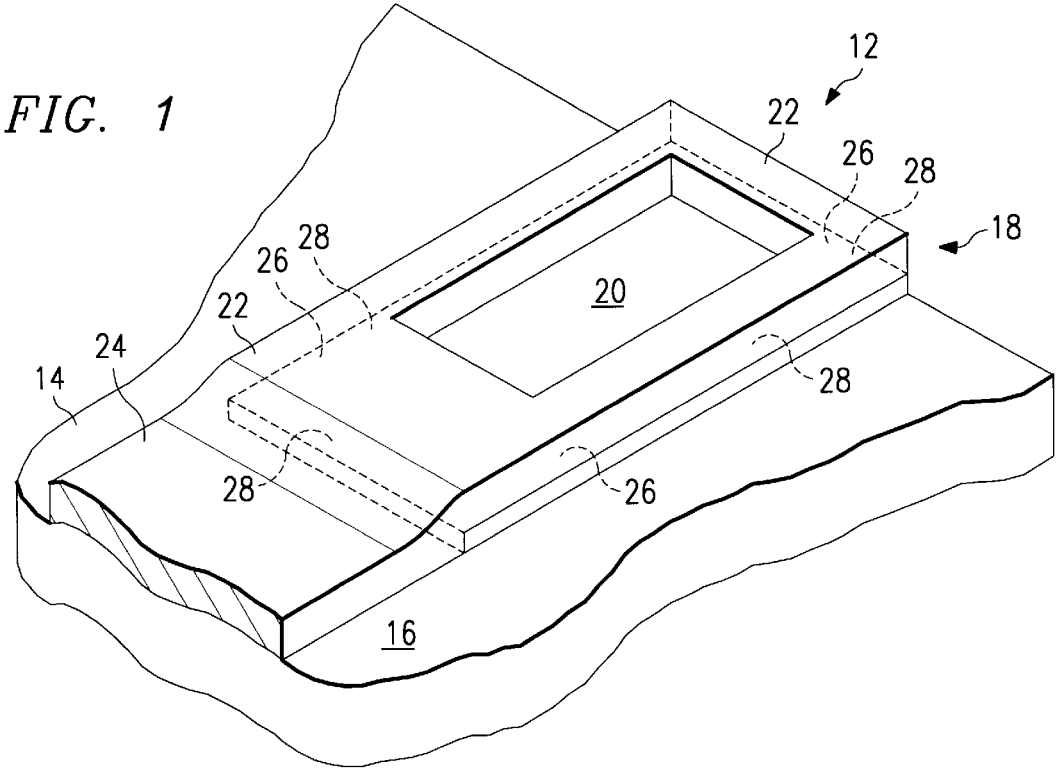
FIG. 1 illustrates a perspective view of a bond pad constructed in accordance with one embodiment of the present invention.

FIG. 1 illustrates an integrated circuit chip 12 comprising an integrated circuit 14 formed on a semiconductor layer 16. The semiconductor layer 16 may be a substrate such as a wafer. It will be understood that the semiconductor layer 16 may also be a layer of semiconductor material formed on a substrate. For example, the semiconductor layer 16 may be an epitaxial layer grown on a wafer.

The integrated circuit 14 may include one or more bond pads 18 for electrically coupling the integrated circuit 14 to a device (not shown). The device may be a lead frame, a printed circuit board, an interposer or the like.

The bond pad 18 may comprise a base 20 and a segment 22 of an interconnect 24. For the embodiment of FIG. 1, the base 20 may be substantially rectangular in shape. It will be understood that the base 20 may be other shapes and/or configurations within the scope of the present invention.

The base 20 may be formed of a material to which an electrical connector may be reliably bonded both electrically and mechanically. Accordingly, bondability governs selection of the material of the base 20. In one embodiment, the base 20 may comprise aluminum formed from a stack of electrically interconnect lower layers associated with the semiconductor process. The aluminum base 20 provides a reliable electrical and mechanical bond with present wedge and ball bonding methods. For an aluminum connector, the base 20 may comprise thin aluminum metal. In this embodiment, the base 20 may have a thickness of between 2 and 7 μm. It will be understood that the base 20 may have a different thickness or comprise other materials within the scope of the present invention.

The interconnect 24 may electrically couple the integrated circuit 14 to the bond pad 18. To provide a low resistance electrical flow path between the integrated circuit 14 and the bond pad 18, the interconnect 24 may comprise thick plated metal. Accordingly, resistance governs selection of the material of the interconnect 24. In one embodiment, the interconnect 24 may comprise thick plated copper or a similar material capable of reducing parasitic metal resistance. Accordingly, the thick plated copper provides a low resistance path. In this embodiment, the copper plating may have a thickness between 6 and 30 µm. It will be understood that the interconnect 24 may comprise other types of materials within the scope of the present invention including stacked or alloyed metal systems.

The segment 22 of the interconnect 24 may contact a periphery 26 of the bond pad base 20 to electrically couple the interconnect 24 to the bond pad 18. For the embodiment of FIG. 1, the periphery 26 may be substantially rectangular in shape. It will be understood that the periphery 26 may be other shapes and/or configurations within the scope of the present invention. For example, in another embodiment, the periphery 26 may be circular.

In accordance with the present invention, the segment 22 may contact an extended section 28 of the periphery 26. The extended section 28 comprises more than a localized contact point. In one embodiment, for example, the extended section 28 may extend along the majority of one or more sides of the base 20. In another embodiment, as shown by FIG. 1, the segment 22 may contact the entire periphery 26 of the base 20.

The extended contact between the base 20 and the interconnect 24 provides a larger coupling path for current to flow from the interconnect 24 to the base 20. Accordingly, current is redistributed around the base 20 and the effective electrical resistance of the bond pad 18 comprising the base 20 and the segment 22 of the interconnect 24 contacting the periphery 28 is proportionally reduced.

Figure 2:
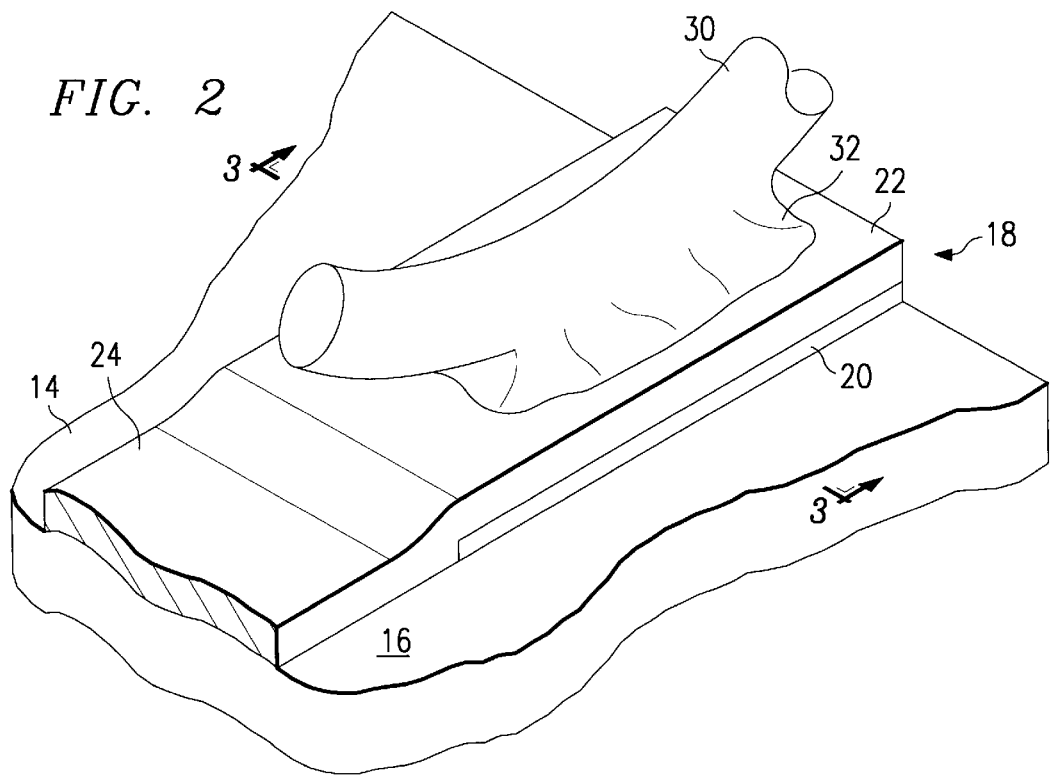
FIG. 2 illustrates a perspective view of a connector wedge bonded to the bond pad of FIG. 1.

Referring to FIG. 2, a connector 30 may be secured to the bond pad 18 by a bond 32. The connector 30 may electrically couple the bond pad 18 to a device. As previously described, the device may be a lead frame, printed circuit board, interposer or the like.

In one embodiment, the connector 30 may be aluminum wire having a diameter between 2 and 20 mils. The aluminum wire will form a good bond with an aluminum base 20 of the bond pad 18. It will be understood that the connector 30 may comprise other materials capable of electrically coupling the bond pad 18 to the device within the scope of the present invention.

For the embodiment of FIG. 2, the bond 32 may be a wedge bond. The wedge bond may be formed by disposing the connector 30 against the base 20 and rapidly vibrating the connector 30 against the base 20. The wedge bond is self-aligned by the segment 22 of the interconnect 24 contacting the periphery 26 of the base 20. Energy created by the vibration liquefies abutting portions of the connector 30 and base 20 which will then resolidify as the bond 32. Wedge bonds are well known in the art and will not be further described herein.

Figure 3:
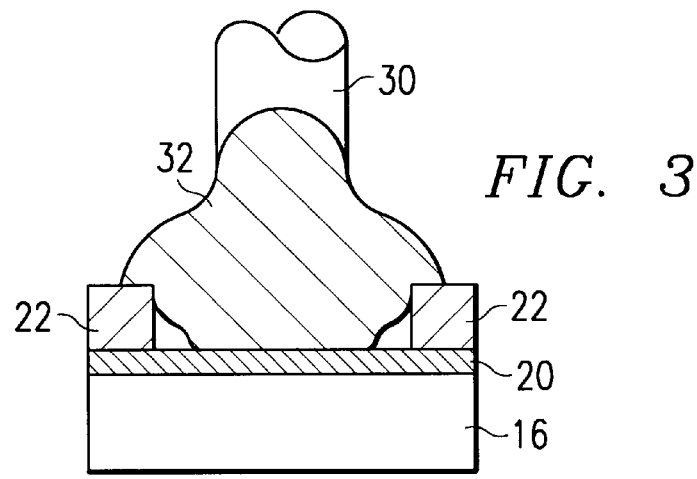
FIG. 3 illustrates a cross-sectional view along lines 3—3 of the wedge bond of FIG. 2.

In accordance with another aspect of the present invention, the bond 32 may contact the segment 22 of the interconnect 24. As shown by FIG. 3, the contact between the interconnect 24 and the bond 32 creates a dual surface bond between the bond pad 18 and the connector 30. Accordingly, current distribution is increased at the bond pad 18 and resistance further reduced.

In one embodiment, an entirety of a circumference of the bond 32 may contact the segment 22 of the interconnect 24. It will be understood that less than the entire circumference of the bond 32 may contact the segment 22 of the interconnect 24. In another embodiment, for example, the bond 32 may have a plurality of sides of which two or more contact the segment 22 of the interconnect 24.

Figure 4:
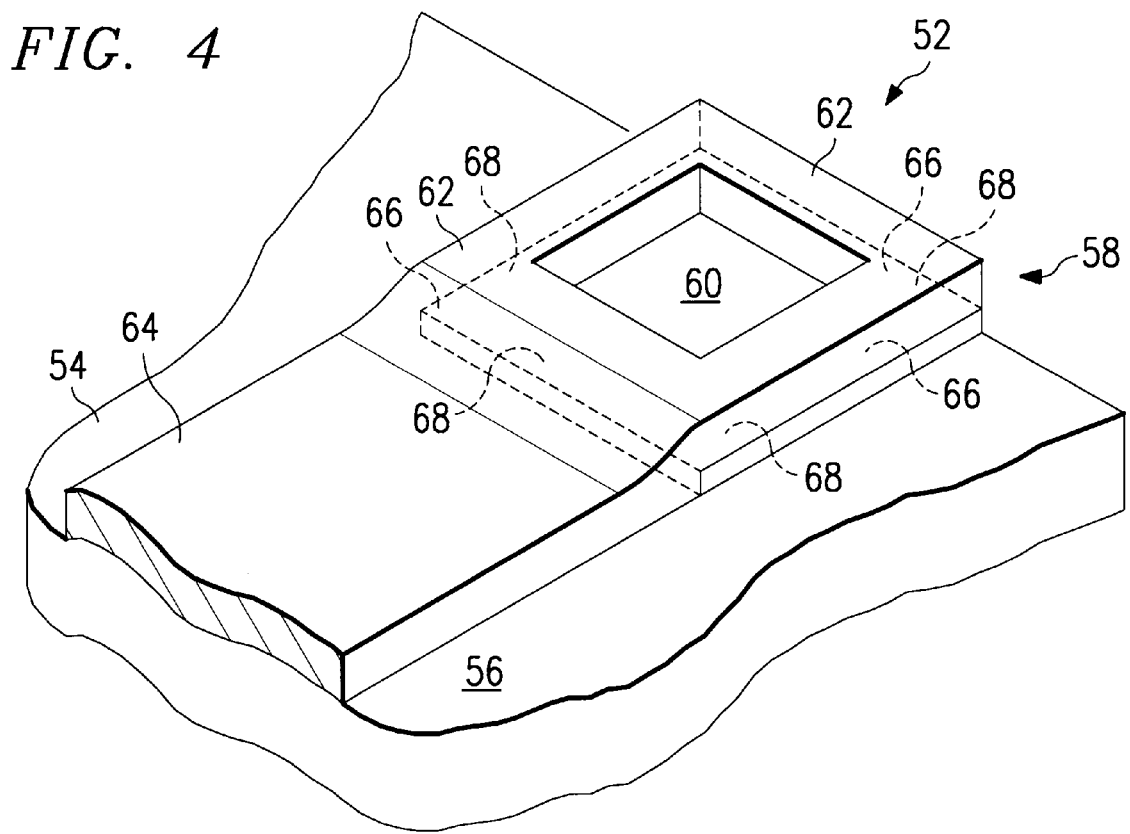
FIG. 4 illustrates a perspective view of a bond pad constructed in accordance with another embodiment of the present invention.
Figure 5:
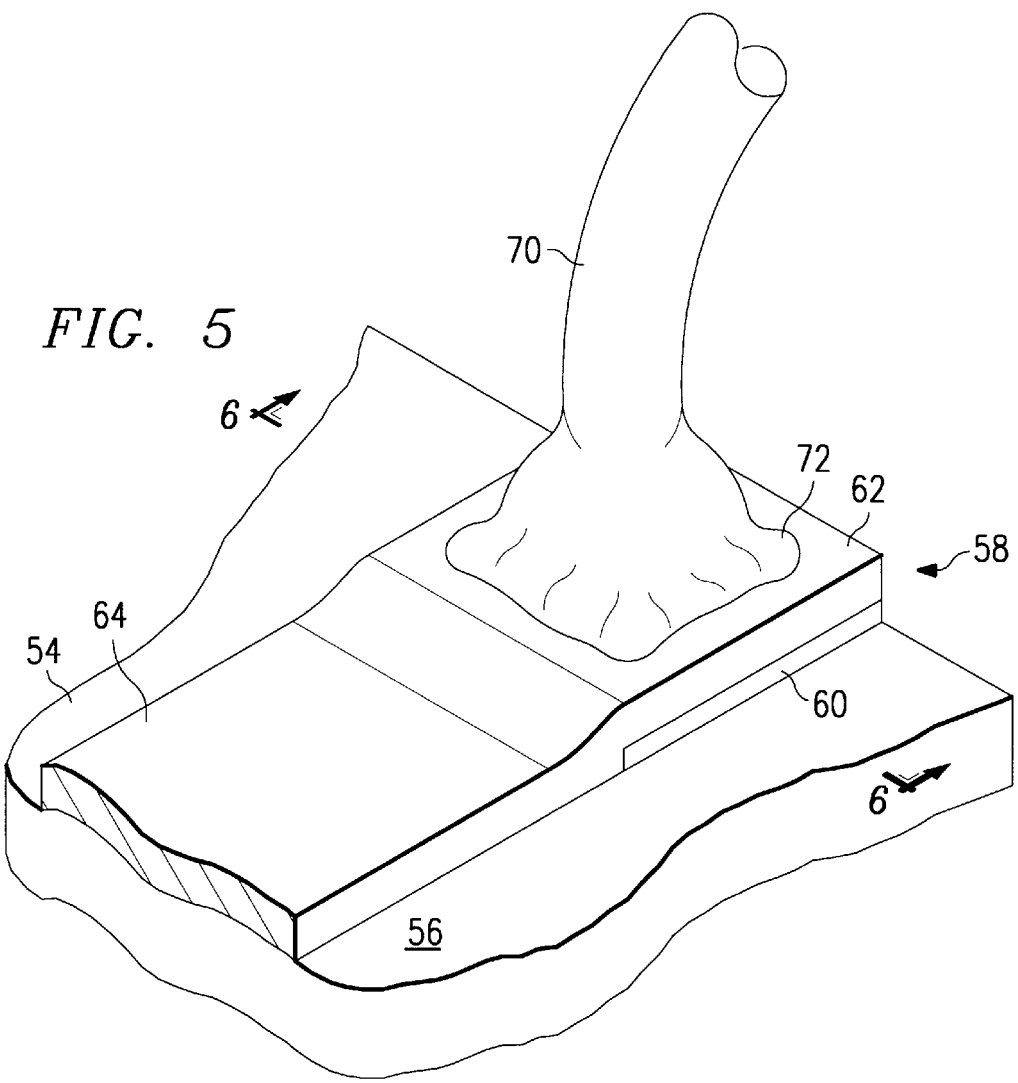
FIG. 5 illustrates a connector ball bonded to the bonding pad of FIG. 4.
Figure 6:
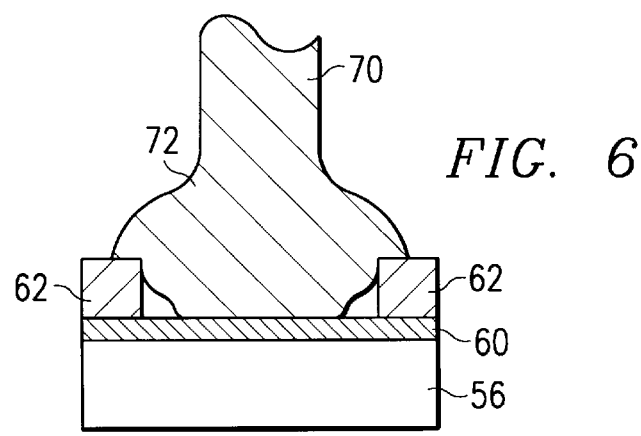
FIG. 6 illustrates a cross-sectional view along lines 6—6 of the ball bond of FIG. 5.

FIGS. 4–6 illustrate another embodiment of the present invention in which the connector is secured to the bond pad with a ball bond. In FIG. 4, an integrated circuit chip 52 may comprise an integrated circuit 54 formed on a semiconductor layer 56. The semiconductor layer 56 may be a substrate such as a wafer. It will be understood that the semiconductor layer 56 may also be a layer of semiconductor material formed on a substrate. For example, the semiconductor layer 56 may be an epitaxial layer grown on a wafer.

The integrated circuit 54 may include one or more bond pads 58 for electrically coupling the integrated circuit 54 to a device (not shown). As previously described, the device may be a lead frame, a printed circuit board, an interposer or the like.

The bond pad 58 may comprise a base 60 and a segment 62 of an interconnect 64. For the embodiment of FIG. 4, the base 60 may be substantially square in shape. It will be understood that the base 60 may be other shapes and/or configurations within the scope of the present invention.

The base 60 may be formed of a material to which an electrical connector may be reliably bonded both electrically and mechanically. Accordingly, bondability governs selection of the material of the base 60. In one embodiment, the base 60 may comprise aluminum formed from a stack of several layers of interconnecting material associated with the semiconductor process. The base 60 provides a reliable electrical and mechanical bond with present wedge and ball bonding methods. For an aluminum connector, the base 60 may comprise thin aluminum metal. In this embodiment, the base 60 may have a thickness of between 2 and 7 µm. It will be understood that the base 60 may have a different thickness or comprise other materials within the scope of the present invention.

The interconnect 64 may electrically couple the integrated circuit 54 to the bond pad 58. To provide a low resistance electrical flow path between the integrated circuit 54 and the bond pad 58, the interconnect 64 may comprise thick plated metal. Accordingly, resistance governs selection of the material of the interconnect 64. In one embodiment, the interconnect 64 may comprise thick plated copper or a similar material capable of reducing parasitic metal resistance. Accordingly, thick plated copper provides a low resistance path. In this embodiment, the copper plating may have a thickness between 8 and 30 µm. It will be understood that the interconnect 64 may comprise other types of materials within the scope of the present invention including stacked or alloyed metal systems.

The segment 62 of the interconnect 64 may contact a periphery 66 of the bond pad base 60 to electrically couple the interconnect 64 to the bond pad 68. For the embodiment of FIG. 4, the periphery 66 may be substantially rectangular in shape. It will be understood that the periphery 66 may be other shapes and/or configurations within the scope of the present invention. For example, in another embodiment, the periphery 66 may be substantially circular in shape.

In accordance with the present invention, the segment 62 may contact an extended section 68 of the periphery 66. The extended section 68 comprises more than a localized contact point. In one embodiment, for example, the extended section 68 may extend along the majority of one or more sides of the base 60. In another embodiment, as shown by FIG. 4, the segment 62 may contact the entire periphery 66 of the base 60.

The extended contact between the base 60 and the interconnect 64 provides a larger coupling path for current to flow from the interconnect 64 to the base 60. Accordingly, current is redistributed around the base 60 and the effective electrical resistance of the bond pad 58 comprising the base 60 and the segment 62 of the interconnect 64 contacting the periphery 66 is proportionally reduced.

Referring to FIG. 5, a connector 70 may be secured to the bond pad 58 by a bond 72. The connector 70 may electrically couple the bond pad 58 to a device. As previously described, the device may be a lead frame, printed circuit board, interposer or the like.

In one embodiment, the connector 70 may be gold wire having a diameter between 2 and 20 mils. The gold wire will form a good bond with an aluminum base 60 of the bond pad 58. It will be understood that the connector 70 may comprise other materials capable of electrically coupling the bond pad 58 to the device within the scope of the present invention.

For the embodiment of FIG. 5, the bond 72 may be a ball bond. The ball bond may be formed by disposing a molten gold or other bond wire metal ball between the connector 70 and the base 60. The ball bond is self-aligned by the segment 62 of the interconnect 64 contacting the periphery 66 of the base 60. The molten gold or other bond wire metal solidifies as the bond 72. Ball bonds are well known in the art and will not be further described herein.

In accordance with another aspect of the present invention, the bond 72 may contact the segment 62 of the interconnect 64. As shown by FIG. 6, the contact between the interconnect 64 and the bond 72 creates a dual surface bond between the bond pad 58 and the connector 70. Accordingly, current distribution is increased at the bond pad 58 and resistance further reduced.

In one embodiment, an entirety of a circumference of the bond 72 may contact the segment 62 of the interconnect 64. It will be understood that less than the entire circumference of the bond 72 may contact the segment 62 of the interconnect 64. In another embodiment, for example, the bond 72 may have a plurality of sides of which two or more contact the segment 62 of the interconnect 64.

Although the present invention has been described with several embodiments, various changes and modifications may be suggested to one skilled in the art. It is intended that the present invention encompass such changes and modifications as fall within the scope of the appended claims.

What is claimed is:

1. A bond pad, comprising:

a base of bondable material;

the base having a periphery;

a segment of an interconnect contacting an extended section of the periphery to electrically couple the interconnect to the bond pad; and the interconnect comprising a material less resistive than the bondable material.

2. The bond pad of claim 1, further comprising the segment contacting a quarter of the periphery.

3. The bond pad of claim 1, further comprising the segment contacting half of the periphery.

4. The bond pad of claim 1, further comprising the segment contacting three quarters of the periphery.

5. The bond pad of claim 1, further comprising the segment contacting an entirety of the periphery.

6. The bond pad of claim 1, the base further comprising aluminum.

7. The bond pad of claim 1, the interconnect further comprising plated copper.

8. A bond pad, comprising:

a base of bondable material;

a segment of an interconnect contacting the base to electrically couple the interconnect to the bond pad;

the interconnect comprising a material less resistive than the bondable material;

a bond attaching a connector to the base, the connector operable to electrically couple the bond pad to a device; and the bond contacting the segment.

9. The bond pad of claim 8, further comprising the segment contacting a quarter of a circumference of the bond.

10. The bond pad of claim 8, further comprising the segment contacting half of a circumference of the bond.

11. The bond pad of claim 8, further comprising the segment contacting three quarters of a circumference of the bond.

12. The bond pad of claim 8, further comprising the segment contacting an entirety of a circumference of the bond.

13. The bond pad of claim 8, the device further comprising a lead frame.

14. The bond pad of claim 8, further comprising:

the bond having a plurality of sides; and the segment contacting two of the sides.

15. The bond pad of claim 14, further comprising the interconnect contacting each side of the bond.

16. The bond pad of claim 8, the base further comprising aluminum.

17. The bond pad of claim 8, the interconnect further comprising plated copper.

18. The bond pad of claim 8, further comprising the bond self-aligned by the segment of the interconnect contacting the periphery of the base.

* * * * *

UNITED STATES PATENT AND TRADEMARK OFFICE
CERTIFICATE OF CORRECTION

PATENT NO. : 5,905,308
DATED : May 18, 1999
INVENTOR(S) : Efland et al.

It is certified that error appears in the above-identified patent and that said Letters Patent is hereby corrected as shown below:

On the title page, insert the related U.S. application data as noted:
-- [60] Provisional application No. 60/031,474 Nov. 25, 1996 --

Signed and Sealed this

Twenty-ninth Day of February, 2000

Attest:

Q. TODD DICKINSON

*Attesting Officer*    *Commissioner of Patents and Trademarks*